US008873235B2

(12) United States Patent
Chen

(10) Patent No.: US 8,873,235 B2
(45) Date of Patent: Oct. 28, 2014

(54) CONTAINER DATA CENTER AND HEAT DISSIPATION SYSTEM THEREOF

(75) Inventor: Chin-Hui Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 84 days.

(21) Appl. No.: 13/596,070

(22) Filed: Aug. 28, 2012

(65) Prior Publication Data

US 2014/0049913 A1 Feb. 20, 2014

(30) Foreign Application Priority Data

Aug. 15, 2012 (TW) .............................. 101129638 A

(51) Int. Cl.
*H05K 7/20* (2006.01)
*H05K 5/00* (2006.01)

(52) U.S. Cl.
USPC ........... 361/694; 454/184; 361/724; 361/725; 361/726; 361/727

(58) Field of Classification Search
CPC ................. G06F 1/16–1/1654; G06F 1/1656; G06F 1/1662–1/1681; G06F 1/1684–1/189; G06F 1/20; G06F 1/203; G06F 1/206; G06F 2200/201; G06F 2200/202; G06F 2200/203; H05K 5/00; H05K 5/0026; H05K 5/0082; H05K 5/0021; H05K 5/0086–5/06; H05K 5/069; H05K 7/005–7/08; H05K 7/20; H05K 7/00; H05K 7/1422; H05K 1/0218–1/0219; H05K 1/00; H05K 3/00; H05K 9/00; H01K 1/00; H01K 3/00; H02B 1/00; H01H 37/00; H01G 2/00; H01G 4/00; H01G 5/00; H01G 7/00; H01G 9/00–9/155; H01G 11/00; H02G 3/00; H02G 5/00; H02G 7/00; H02G 9/00; H02G 11/00; H02G 13/00; H02G 15/00; H01B 7/00; H01B 11/00; H01B 17/00; H01R 4/00; H01R 9/00; H01R 13/00
USPC .................. 361/679.46–679.54, 688–723, 361/724–727; 454/184; 700/300; 62/259.2, 62/238.3, 89
See application file for complete search history.

(56) References Cited

U.S. PATENT DOCUMENTS

| | | | | |
|---|---|---|---|---|
| 7,031,154 | B2 * | 4/2006 | Bash et al. .................... | 361/690 |
| 7,542,287 | B2 * | 6/2009 | Lewis et al. .................. | 361/695 |
| 7,878,889 | B2 * | 2/2011 | Day .............................. | 454/184 |
| RE42,195 | E * | 3/2011 | Bash et al. .................... | 700/276 |
| 7,995,341 | B2 * | 8/2011 | Wu et al. ....................... | 361/695 |
| 8,593,815 | B2 * | 11/2013 | Claassen et al. ............. | 361/724 |
| 2008/0232069 | A1 * | 9/2008 | Chu et al. ..................... | 361/724 |
| 2008/0300725 | A1 * | 12/2008 | Brey et al. .................... | 700/278 |
| 2009/0107652 | A1 * | 4/2009 | VanGilder et al. ........... | 165/80.2 |
| 2009/0310300 | A1 * | 12/2009 | Chrysler ....................... | 361/691 |
| 2011/0105010 | A1 * | 5/2011 | Day .............................. | 454/184 |
| 2011/0122570 | A1 * | 5/2011 | Beck et al. ............... | 361/679.46 |
| 2011/0197612 | A1 * | 8/2011 | Campbell et al. ............ | 62/259.2 |

* cited by examiner

*Primary Examiner* — Jayprakash N Gandhi
*Assistant Examiner* — Razmeen Gafur
(74) *Attorney, Agent, or Firm* — Novak Druce Connolly Bove + Quigg LLP

(57) ABSTRACT

A container data center includes a container having a raised floor defining a number of vents, a server system including a cabinet supported on the raised floor adjacent to the vents, a cooling device, an adjusting plate movably installed to the cabinet for covering or uncovering the vents, a driving member, a temperature sensor mounted to the cabinet, and a micro control unit (MCU) electrically connected to the driving member and the temperature sensor. The cooling device releases cooling air into the container under the raised floor. The temperature sensor senses the temperature in the cabinet. The MCU receives the sensed temperature and compares the sensed temperature with a preset temperature, to direct the driving member to drive the adjusting plate to move relative to the vents.

7 Claims, 2 Drawing Sheets

CONTAINER DATA CENTER AND HEAT DISSIPATION SYSTEM THEREOF

BACKGROUND

1. Technical Field

The present disclosure relates to data centers, and particularly, to a container data center with a heat dissipation system.

2. Description of Related Art

Data centers are centralized computing facilities that include many servers often arranged on server racks or shelves, with one rack or shelf of servers considered one server system. The server systems are contained in a container. In a working state, the server systems generate heat in the data center. Therefore effectively dissipating heat from the container is necessary.

Data centers often include a raised floor defining a plurality of vents to support the server systems. Cooling air pipes are arranged under the raised floor. Cooling air released from the pipes flows upwards though the vents of the raised floor to cool the server systems. If some server systems are not installed, less heat will be generated accordingly, however, the same amount of cooling air flows is still passing through the corresponding vents for cooling the server systems as if all the servers are installed, which is not ideal for effective heat dissipation.

BRIEF DESCRIPTION OF THE DRAWINGS

Many aspects of the present embodiments can be better understood with reference to the following drawing. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
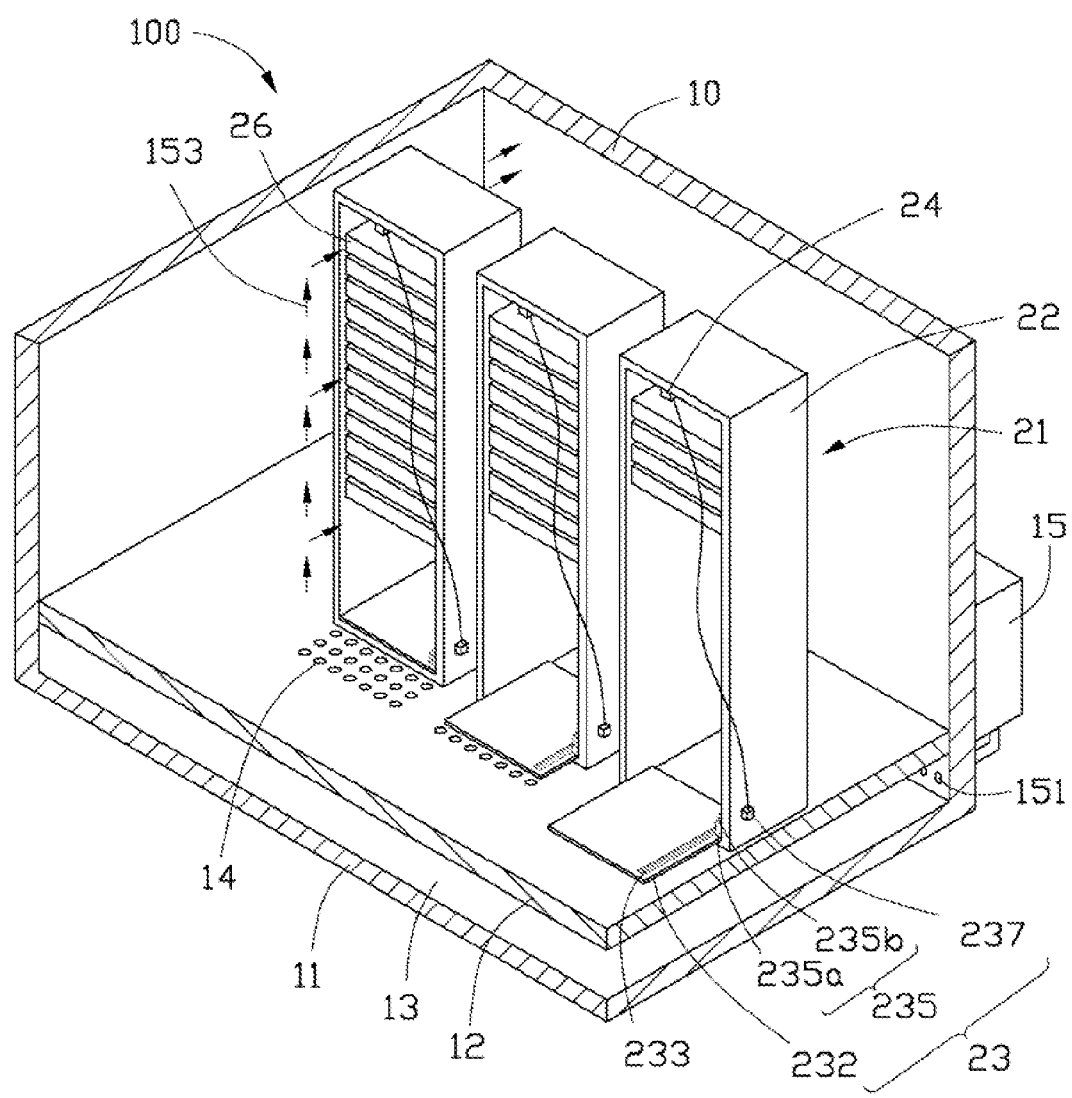
FIG. 1 is a cutaway, isometric view of an embodiment of a container data center, wherein the container data center includes a heat dissipation system.
Figure 2:
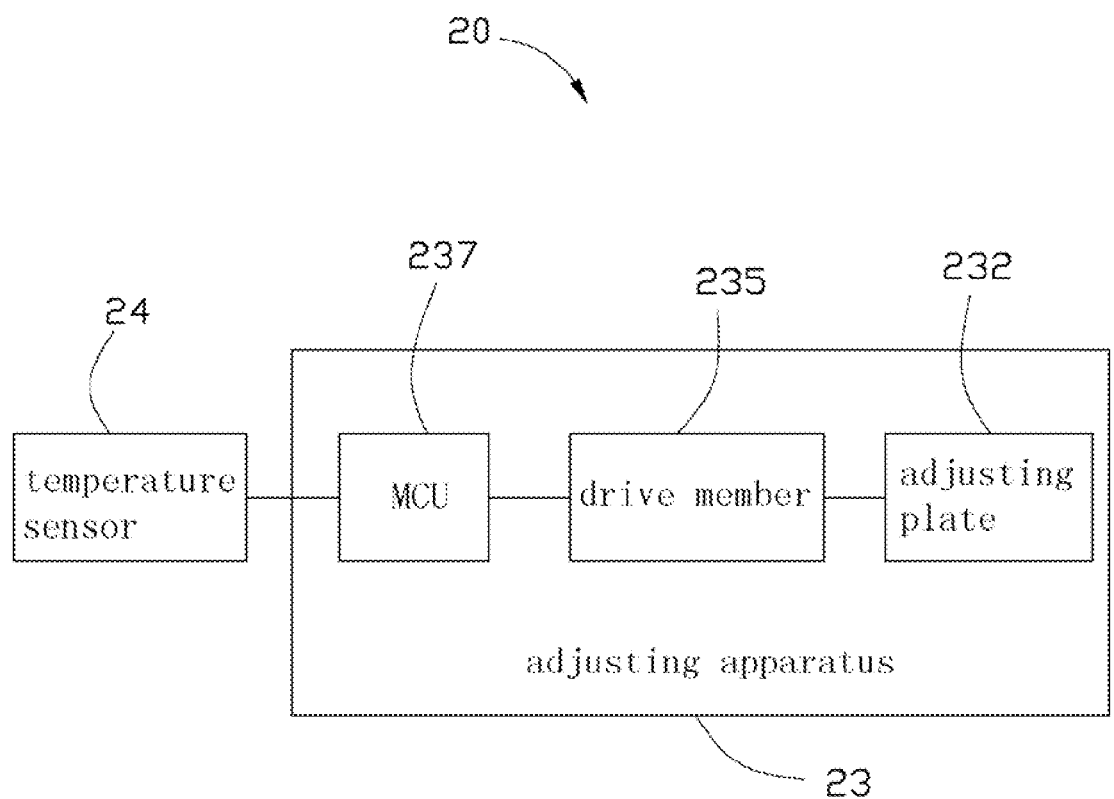
FIG. 2 is a block diagram of the heat dissipation system of FIG. 1.

Referring to FIGS. 1 and 2, an embodiment of a container data center 100 includes a container 10, and a row of server systems 21 received in the container 10.

The container 10 includes a bottom wall 11, a raised floor 12 spaced from the bottom wall 11 above the bottom wall 11, and a cooling device 15 installed on an outer surface of the container 10. The bottom wall 11 and the raised floor 12 cooperatively bound a space 13. An air outlet 151 of the cooling device 15 communicates with the space 13. The server systems 21 are supported on the raised floor 12. The raised floor 12 defines a plurality of vents 14 adjacent to the server systems 21. Cooled air 153 generated by the cooling device 15 is forced into the space 13, through the vents 14, and flows through the server systems 21 to cool the server systems 21. In the embodiment, the cooling device 15 is an air conditioner.

Each server system 21 includes a cabinet 22 supported on the raised floor 12 and adjacent to the corresponding vents 14, an adjusting apparatus 23, a temperature sensor 24 installed on a top of the cabinet 22, and a plurality of servers 26 installed in the cabinet 22. The adjusting apparatus 23 includes an adjusting plate 232 movably installed to the cabinet 22 for shielding the vents 14, a drive member 235 installed to the cabinet 22 for driving the adjusting plate 232 to move relative to the vents 14, and a micro control unit (MCU) 237 to control the drive member 235. The MCU 237 is electrically connected to the driving member 235 and the temperature sensor 24. The adjusting apparatus 23, the cooling device 15, and the temperature sensor 24 form a heat dissipation system 20 of the container data center 100. In the embodiment, the adjusting plate 232 defines a rack 233. The drive member 235 includes a motor 235a with a driving roller 235b meshing with the rack 233. The motor 235a drives the driving roller 235b to rotate, for moving the adjusting plate 232 relative to the vents 14.

In use, each temperature sensor 24 determines the temperature of the corresponding server system 21. The MCU 237 receives a temperature signal from the temperature sensor 24 and compares the temperature sensed by the temperature sensor 24 with a preset temperature stored in the MCU 237. If the sensed temperature exceeds the preset temperature, the MCU 237 directs the driving roller 235b to rotate, the adjusting plate 232 moves toward the corresponding server system 21 for uncovering more vents 14. If the sensed temperature is less than or equal to the preset temperature, the MCU 237 directs the driving roller 235b to rotate reversely, the adjusting plate 232 moves away from the corresponding server system 21 for shielding the vents 14.

According to the above system, all of the cooled air 153 can efficiently dissipate the heat of the server systems 21 that are operating, which can save electricity.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A heat dissipation system to cool a container data center, the data center comprising a container with a raised floor defining a plurality of vents and a server system supported on the raised floor adjacent to the vents, the heat dissipation system comprising:

a cooling device to release cooling air into the container under the raised floor;

an adjusting plate movably installed to the server system for covering or uncovering the vents;

a driving member driving the adjusting plate to move;

a temperature sensor mounted to the server system to sense the temperature of the dissipated air of the server system; and a micro control unit (MCU) electrically connected to the driving member and the temperature sensor;

wherein the MCU receives a sensed temperature from the temperature sensor and compares the sensed temperature with a preset temperature, to direct the driving member to drive the adjusting plate to move relative to the vent; and wherein the adjusting plate defines a rack, the driving member comprises a motor with a driving roller meshing with the rack.

2. The heat dissipation system of claim 1, wherein the MCU directs the driving member to move the adjusting plate to uncover one or more of the vents in response to the sensed temperature exceeding the preset temperature.

3. The heat dissipation system of claim 1, wherein the MCU directs the driving member to move the adjusting plate to cover one or more of the vents in response to the sensed temperature being less than or equal to the preset temperature.

4. A container data center, comprising:
- a container comprising a bottom wall, and a raised floor spaced from and above the bottom wall, the bottom wall and the raised floor bounding a space, the raised floor defining a plurality of vents communicating with the space;
- a server system received in the container, and comprising a cabinet adjacent to the vents and supported on the raised floor, and a plurality of servers installed in the cabinet;
- a cooling device comprising an air outlet communicating with the space;
- an adjusting plate movably installed to the cabinet for covering or uncovering the vents;
- a driving member driving the adjusting plate to move;
- a temperature sensor mounted to the cabinet to sense the temperature of dissipated air of the servers; and
- a micro control unit (MCU) electrically connected to the driving member and the temperature sensor;
- wherein the MCU receives a sensed temperature from the temperature sensor and compares the sensed temperature with a preset temperature, to direct the driving member to drive the adjusting plate to move relative to the vents; and
- wherein the adjusting plate defines a rack, the driving member comprises a motor with a driving roller meshing with the rack.

5. The container data center of claim 4, wherein the MCU directs the driving member to move the adjusting plate to uncover one or more of the vents in response to the sensed temperature exceeding the preset temperature of the MCU.

6. The container data center of claim 4, wherein the MCU directs the driving member to move the adjusting plate to cover one or more of the vents in response to the sensed temperature being less than or equal to the preset temperature.

7. The container data center of claim 4, wherein the cooling device is air conditioner.

\* \* \* \* \*